United States Patent [19]
Christiansen

[11] Patent Number: 5,490,965
[45] Date of Patent: Feb. 13, 1996

[54] METHOD FOR CLOSING HOLES IN CERAMIC SUBSTRATES

[75] Inventor: Frank J. Christiansen, Colorado Springs, Colo.

[73] Assignee: Hewlett-Packard Company, Palo Alto, Calif.

[21] Appl. No.: 315,057

[22] Filed: Sep. 29, 1994

Related U.S. Application Data

[62] Division of Ser. No. 185,620, Jan. 24, 1994.

[51] Int. Cl.$^6$ ................................................. B29C 71/00
[52] U.S. Cl. ............................. 264/237; 264/60; 264/61; 264/234; 264/259
[58] Field of Search ................................. 264/234, 259, 264/60, 61, 237

[56] References Cited

U.S. PATENT DOCUMENTS 4,020,206  4/1977  Beil ........................................ 428/137
4,299,873  11/1981  Ogihara et al. ........................ 428/137

*Primary Examiner*—Christopher A. Fiorilla

[57] ABSTRACT

A method for closing holes in a ceramic substrate may include the steps of filling the holes with a paste including a ceramic filler material and an alumina powder suspended in an organic carrier; firing the substrate at a temperature sufficient to burn off the organic carrier, but lower than the melting temperature of the ceramic sealing material; maintaining the substrate at the burn-off temperature for a time period sufficient to burn off substantially all of the organic carrier; raising the temperature of the ceramic substrate to a sealing temperature sufficient to melt the ceramic sealing material, but lower than the melting temperature of the ceramic stabilizing material; maintaining the ceramic substrate at the sealing temperature for a time period sufficient to allow the molten ceramic sealing material to fill interstices in the hole; and cooling the substrate.

6 Claims, 1 Drawing Sheet

METHOD FOR CLOSING HOLES IN CERAMIC SUBSTRATES

This is a divisional of application Ser. No. 08/185,620 filed on Jan. 24, 1994.

BACKGROUND

This invention relates to a paste for filling holes in ceramic substrates and a method for using the paste.

Ceramic circuit boards or substrates are often used in the manufacture of electronic equipment due to their ruggedness and resistance to environmental extremes. For example, ceramic circuit boards are commonly used in the manufacture of hybrid circuits, i.e., electronic circuits mounted on "thick film" ceramic substrates. These hybrid circuits may then be employed in a wide range of devices, such as electronic test equipment, computers, and electronic equipment for aircraft, just to name a few. Several other uses for ceramic hybrid circuits are shown and described in the October 1993 issue of Semiconductor International at page 56 in an article entitled "Will Hybrid Circuits Survive?", the disclosure of which is hereby incorporated by reference.

Most hybrid circuits of the kind described above typically comprise a ceramic substrate to which are mounted a variety of raw integrated circuit chips, i.e., integrated circuits that have not been encapsulated in a protective plastic package. The various integrated circuit chips are electrically connected to one another by a plurality of conductive metallic traces (printed circuits) deposited directly on the substrate. In most cases, the substrate also includes passive electronic components, such as resistors and capacitors, required to make the circuit functional. The passive circuit elements are usually manufactured directly on the ceramic substrate by any number of well-known processes. Once all of the electronic components are in place, they are enclosed by a cover which provides mechanical protection and hermetically seals the components from the external environment.

While it is possible to fabricate a functional hybrid circuit by placing all of the electronic components and conductive traces on the front side of the ceramic substrate, it is often necessary to include additional conductive traces on the back side of the substrate, particularly if the circuit is complex. If that is the case, the conductive traces on the back side of the substrate are usually connected to the appropriate conductive traces on the front side of the substrate by electrically conductive vias or holes. Basically, an electrically conductive hole is formed by drilling a small hole through the substrate at the appropriate location. The hole is then made electrically conductive by depositing a thin layer of metal on the walls of the hole by any one of a number of well-known processes. In this manner it is possible to provide the additional electrical connections required for complex circuits. However, even if such additional conductive traces are not required, it is common to deposit a thin layer of metal on the back side of the substrate to act as a ground plane. If so, the appropriate ground points on the conductive traces on the front side of the substrate are connected to the ground plane on the back side of the substrate by electrically conductive holes.

While the use of such electrically conductive holes is convenient and has solved many problems, they often prevent the formation of a true hermetic seal (i.e., a seal impervious to both liquids and gases) between the electronic components on the front surface of the substrate and the external environment. Specifically, if the holes themselves are not hermetically sealed, then the environmental immunity, thus reliability, of the entire hybrid circuit is compromised. Consequently, several methods have been developed in an effort to close the holes and orovide the desired hermetic seal.

One method for closing the holes has been to cement a small epoxy-coated fiberglass disk or "manhole cover" over the hole. Unfortunately, however, the epoxy resins that are commonly used to cement the disk or "manhole cover" to the substrate are water permeable, thus do not provide a true hermetic seal. Also, the process of placing and securing a disk over each individual hole in the substrate is tedious and time consuming. Moreover, since the disks are relatively large, it may be difficult to seal holes that are close together.

Other methods fill the holes with epoxy resins or, alternatively, silicone elastomers. Such methods generally include the steps of placing a screen or template over the substrate to mask the entire substrate except for the holes and then force the fill material into the exposed holes by a suitable means, such as a squeegee. While such methods eliminate the tedious chore of placing a ceramic disk over each individual hole, they are no panacea, and suffer from their own disadvantages. For example, it is difficult to achieve a reliable seal and even if a reliable seal is achieved, it is usually not hermetic. Moreover, the coefficient of thermal expansion of the fill material is usually quite different from the coefficient of thermal expansion of the substrate, thus creating the possibility of hole leakage when the circuit is exposed to extreme temperatures. Another disadvantage is that small variations in the composition of the fill material tend to greatly affect the reliability of the seal. For example, even minor variations that exist between different lots of the same material have caused problems. Obviously, such extreme sensitivity to minor variations in material composition poses significant problems.

In an attempt to overcome some of the foregoing problems, sintered metals, such as gold, have been tried as substitutes for the epoxy resin and silicone elastomer fillers described above. Unfortunately, however, using sintered metals to seal the holes creates a variety of different problems. For example, several filling and sintering steps are commonly required to completely fill the hole, which increases production costs. Also, the resulting seal is not hermetic, so little is gained by using the sintered metal fill material.

Consequently, there remains a need to provide a true hermetic seal for holes in ceramic substrates. The sealing method should be relatively easy to perform and require a minimum number of steps. The material used to fill the hole should be inexpensive, easy to handle, and inert. Moreover, the quality of the seal should not be overly sensitive to minor, but expected, variations in material composition. Finally, the sealing material should be universally applicable with respect to holes which are coated with a metallic composition or uncoated.

SUMMARY OF THE INVENTION

Accordingly, it is a general object of this invention to provide a material for closing holes in ceramic substrates.

Another object is to provide a hermetic seal.

A further object is to provide a material for sealing holes that is relatively insensitive to minor variations in composition.

Still another object is to provide a seal for holes in ceramic substrates that can be achieved in a minimum number of steps.

Yet a further object is to provide a material for sealing holes in ceramic substrates regardless of whether the walls of the hole are coated with a metallic conductor.

Additional objects, advantages, and novel features of this invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purposes of the present invention, as embodied and broadly described herein, the paste for closing holes in ceramic substrates according to this invention may comprise a ceramic filler material suspended in an organic carrier to form a paste. The ceramic filler material includes two components, namely a ceramic sealing material (preferably in powder form) having a melting temperature below the melting temperature of the ceramic substrate, and a ceramic stabilizing material (also preferably in powder form) having a melting temperature higher than that of the ceramic sealing material. The organic carrier may be selected from a wide range of slow drying lacquers, acrylic resins, acetates, or other like materials capable of suspending the ceramic filler material in order to form a viscous slurry.

The method of using the paste to seal holes in the ceramic substrates comprises the steps of filling the holes in the substrate with the paste; firing the substrate at a temperature sufficient to burn off the organic carrier, but lower than the melting temperature of the ceramic sealing material; maintaining the substrate at the burn-off temperature for a time period sufficient to burn off substantially all of the organic carrier; raising the temperature of the ceramic substrate to a sealing temperature sufficient to melt the ceramic sealing material, but lower than the melting temperature of the ceramic stabilizing material; maintaining the ceramic substrate at the sealing temperature for a time period sufficient to allow the molten ceramic sealing material to fill interstices in the hole; and cooling the substrate.

BRIEF DESCRIPTION OF THE DRAWING

The accompanying drawing, which is incorporated herein and forms a part of the specification illustrates preferred embodiments of the present invention, and together with the description, serves to explain the principles of the invention.

The drawing illustrates a cross-section in elevation of a ceramic substrate having an electrically conductive hole sealed by the paste of the present invention.

DETAILED DESCRIPTION OF THE INVENTION

Figure 1:
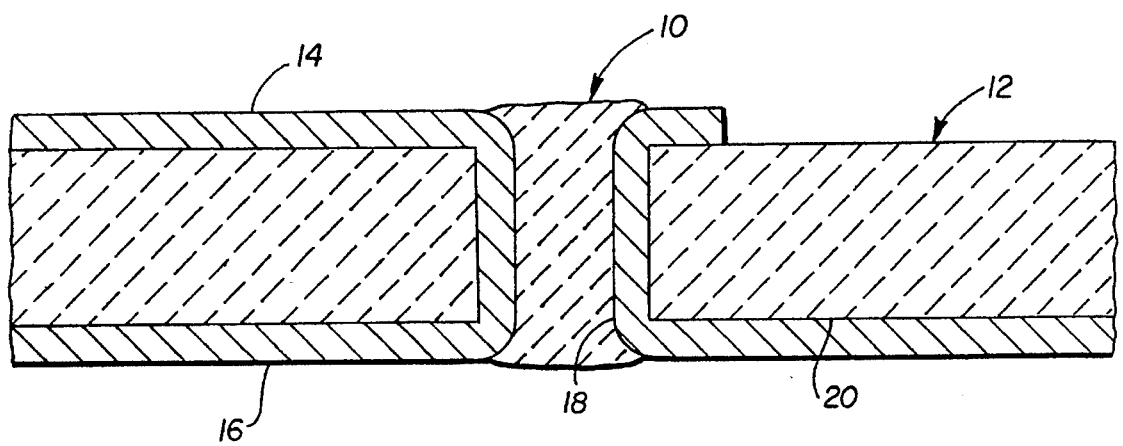

The paste 10 for filling ceramic substrates according to the present invention is shown in the drawing as it could be used to hermetically seal an electrically conductive hole 18 in a ceramic substrate 12. The term "hermetic seal" as used herein shall include, but not be limited to, seals that are impervious to both liquids and gases. Briefly, the paste 10 includes a ceramic filler material suspended in an organic vehicle or carrier to form a paste. The ceramic filler material includes two components in combination and preferably in powder form. The components include a ceramic sealing material having a relatively low melting temperature and a ceramic stabilizing material having a melting temperature higher than that of the ceramic sealing material. Specific and preferred compositions used to produce the paste 10 will be described in more detail below.

The hole 18 is filled with paste 10 by forcing the paste 10 into the hole 18, such as by a squeegee, and letting the paste 10 dry to cement the ceramic filler material in the hole 18. The seal is then made hermetic by a dual temperature firing process. The first step in the process is to fire the substrate at a temperature sufficient to burn off the organic carrier, but below the melting temperature of the ceramic sealing material. After the organic carrier is completely burned off, the temperature is then increased to a temperature sufficient to melt the ceramic sealing material, but not the ceramic stabilizing material. The molten ceramic sealing material then flows throughout the hole 18, filling the small gaps and interstices therein. The ceramic stabilizing material helps to prevent the molten ceramic sealing material from flowing out of the hole during the firing process. Once cooled, the seal achieved by the fired paste of this invention is hermetic, as defined above.

Perhaps the most significant advantage of the present invention is that it provides a true hermetic seal that can be reliably achieved time after time. Moreover, since the ceramic filler material has nearly the same coefficient of thermal expansion ($T_{ce}$) as the surrounding substrate, the seal will remain intact over a wide range of temperature variations. Another advantage is that the paste is inexpensive, easy to manufacture, and usually can be applied in a single step. The paste is also chemically inert, and the quality and reliability of the resulting seal is not overly sensitive to minor variations in material composition, or even the presence of small amounts of impurities. The paste can also be used to seal holes in ceramic substrates regardless of whether the walls of the holes are coated with a metallic conductive material.

As mentioned above, the ceramic filler material comprises a mixture of two different kinds of ceramic compositions. The first ceramic composition consists of a ceramic sealing material (e.g. powder) having a relatively low melting temperature. The second ceramic composition consists of a ceramic stabilizing material (e.g. powder) having a higher melting temperature. The particular ceramic composition used as the ceramic sealing powder is not critical, and a wide range of glass and ceramic powders may be used without departing from the scope of the invention. However, the particular material selected must have a melting temperature greater than the burn-off temperature of the organic carrier material and lower than the melting temperature of the ceramic stabilizing material, as will be described in more detail below. The foregoing requirement generally limits the particular ceramic material to the family of glasses having melting temperatures in the range of about 490° C. to about 530° C. For example, Corning 7556 glass, prepared by Corning Glass Works, will provide excellent results. Once the desired ceramic material is selected, it should be ground to a fine powder, so that it can be distributed uniformly within the paste 10 and more easily fill the voids and interstices within the hole 18. Powder ground so that it passes through a #400 sieve provides excellent results. While many glasses have thermal expansion coefficients ($T_{ce}$) very close to the thermal expansion coefficients of most ceramic substrates, additional durability and reliability can be achieved if the glass used as the sealing powder is selected to have a $T_{ce}$ as close as possible to the $T_{ce}$ of the ceramic substrate.

The ceramic composition used as the ceramic stabilizing powder is also not particularly critical, and need only have a melting temperature higher than the melting temperature of the ceramic material selected as the sealing powder. Of course, the difference between the melting temperatures of the two powders should be sufficient to allow the sealing powder to melt and flow throughout the hole without also melting the stabilizing powder. Since most ceramic substrates are made primarily of alumina ($Al_2O_3$), the use of alumina as the stabilizing powder is ideal, especially since its coefficient of thermal expansion is identical to that of the substrate. As was the case for the sealing powder, the ceramic stabilizing powder should be finely ground, and a #400 sieve powder will provide excellent results.

The organic carrier material can be selected from a wide range of slow drying lacquers, acrylic resins, or other like materials capable of suspending the ceramic filler material to form a viscous slurry, and then drying to cement the filler material within the hole until the substrate can be fired. While the choice of the specific composition of the organic carrier is not particularly critical, it must have a burn-off or oxidation temperature below the melting temperature of the ceramic sealing powder so that the organic carrier material can be completely eliminated without melting the ceramic sealing powder. It is preferred, but not required, that the carrier also be thixotropic, i.e., the viscosity of the carrier should be inversely proportional to the pressure exerted on the carrier. A thixotropic carrier will result in a paste that will readily flow under pressure from the squeegee, thus ensuring good distribution of the paste within the hole, then thicken after the pressure is removed, thus helping to confine the paste within the hole until the carrier dries. Finally, it is also preferred that the organic carrier have a moderate drying time to enhance workability.

In accordance with the foregoing criteria, the following organic carriers have been successfully used for the paste of the present invention: Methyl acetate thinned with terpineol; nitrocellulose thinned with amyl acetate; ethyl acetate thinned with terpineol; and appropriately thinned (such as by terpineol) acrylic resins, for example resins selected from the Elvacite family of acrylic resins prepared by the DuPont Company. Methyl acetate thinned with terpineol is the preferred carrier.

The paste is prepared by first mixing the ceramic sealing powder with the ceramic stabilizing powder to form a homogeneous mixture that will pass through a #400 sieve. In a preferred embodiment, the ceramic sealing powder is Corning 7556 glass having a melting temperature of about 500° C. The ceramic stabilizing powder is alumina powder having a melting temperature of about 2050° C. Good results have been obtained when the homogeneous mixture of powders contains about 20% to 75% by weight glass powder and about 25% to 80% by weight alumina powder, with the preferred ratio being in the range of about 40% to 60% glass powder and 40% to 60% alumina powder.

After the ceramic powders are mixed and sieved, the organic carrier is then added to the ceramic filler material to turn the mixture into a paste. In a preferred embodiment, the paste will contain about 1 part carrier to about 5 to 20 parts ceramic filler material on a weight basis. The preferred ratio is in the range of about 1 part carrier to 10 parts ceramic filler. The organic carrier should be sufficiently thinned so that the final paste has a viscosity in the range of 75,000 to 100,000 centipoise.

A specific example of one use of the paste according to the present invention is shown in the drawing, which shows a ceramic substrate 12 upon which will be mounted a plurality of electronic devices (not shown). The electronic devices will be connected to each other by a plurality of conductive traces 14, one of which is connected to a ground plane conductor 16 on the back side 20 of the substrate 12 by an electrically conductive hole 18.

The process of sealing the hole 18 is carried out by forcing the paste 10 into the hole 18 by any convenient means. In a preferred embodiment, this is done by masking the back surface 20 of the substrate 12 with a stencil that exposes only the holes. A squeegee is then used to force the paste into the exposed holes. If the paste 10 is maintained in the preferred viscosity range of 75,000 to 100,000 centipoise, one pass of the squeegee will usually deposit sufficient paste uniformly in and over the hole, so that the paste 10 will completely seal the hole after the firing process. After each hole 18 is filled, the paste 10 is allowed to dry, which cements the ceramic filler material within the hole 18 until the substrate 12 can be fired. In a preferred embodiment, the paste 10 is dried by heating the substrate and paste to a temperature in the range of about 100° C. to 150° C. (125° C. is preferred) for a time sufficient to drive-off substantially all of the thinner. Alternatively, the paste 10 can be allowed to air dry.

As briefly described above, the paste is sequentially fired at two different temperatures. Firing at the first temperature serves to completely burn off the organic carrier. The second temperature, which is higher than the first, then melts the ceramic sealing powder, which seals the hole. In the preferred embodiment having an organic carrier of methyl acetate thinned with terpineol, the substrate is fired at a temperature in the range of about 250° C. to 300° C. for about 10 to 15 minutes, which is usually sufficient to completely burn off the carrier material. The temperature of the oven is then increased to a temperature in the range of 490° to 530° C. and maintained at this level for about 1–5 minutes, which is sufficient to melt the ceramic sealing powder and fill the interstices within the hole. The substrate is then slowly cooled in accordance with well-known cooling processes known in the circuit fabrication art to prevent stress formation.

This completes the detailed description of the paste for sealing holes in ceramic substrates according to the present invention. While a number of specific materials were described above for the various embodiments of this invention, persons having ordinary skill in the art will recognize that other substitute materials or combinations of materials may be available now or in the future to accomplish comparable functions to the paste according to the present invention. For example, many different kinds of ceramic materials can be used for the sealing and stabilizing powders of the ceramic filler material, and some of the preferred materials were specifically described herein. However, it may be advantageous to substitute other ceramic materials for the materials described herein depending on the specific composition of the ceramic substrate or on the specific environment in which the substrate will be exposed. The selection of such other ceramic materials for a specific application would be obvious to persons having ordinary skill in the art after having become familiar with the teachings of this invention. Likewise, many other organic compositions known in the art may prove to be suitable substitutes for the particular organic compositions specifically described herein, provided that the composition has the desired characteristics listed above.

Still other variations are possible. For example, slight deviations from the firing temperatures and times may be required depending on the particular materials used, the sizes of the ceramic substrates, or the number of filled holes in a given ceramic substrate.

Consequently, the foregoing is considered illustrative only of the principles of the invention. Further, since numerous other modifications and changes will readily occur to those skilled in the art, it is not desired to limit the invention to the exact materials and methods shown and described, and accordingly, all suitable modifications and equivalents may be resorted to as falling within the scope of the invention as defined by the claims which follow.

The embodiments of the invention in which an exclusive property or privilege is claimed are defined as follows:

1. A method for closing holes in a ceramic substrate comprising the steps of:

providing a ceramic substrate comprising at least one hole therethrough, said substrate melting at a first temperature;

filling said hole in said substrate with a paste consisting essentially of a ceramic sealing material which melts at a second temperature that is less than said first temperature at which said ceramic substrate melts, a ceramic stabilizing material which melts at a third temperature that is greater than said second temperature at which said ceramic sealing material melts, and an organic carrier for suspending said ceramic sealing material and said ceramic stabilizing material together in order to form said paste;

heating said ceramic substrate and said paste to a burn-off temperature sufficient to burn off the organic carrier within said paste, said burn-off temperature being less than said second temperature at which said ceramic sealing material melts;

maintaining the ceramic substrate and said paste at said burn-off temperature for a burn-off time period sufficient to burn off substantially all of the organic carrier from said paste;

additionally heating said ceramic substrate and said paste to said second temperature in the range of about 490° C. to 530° C. in order to melt the ceramic sealing material and thereby form molten ceramic sealing material;

maintaining the ceramic substrate at said second temperature for a sealing time period sufficient to allow the molten ceramic sealing material to fill interstices in the hole; and cooling the ceramic substrate in order to cause said molten ceramic sealing material to solidify within said hole.

2. The method of claim 1 wherein said burn-off temperature is in the range of about 250° C. to 300° C.

3. The method of claim 1, wherein said burn-off time period is in the range of about 10 to 15 minutes.

4. The method of claim 1, wherein said sealing time period is in the range of about 1 to 5 minutes.

5. A method for closing holes in a ceramic substrate comprising the steps of:

providing a ceramic substrate comprising at least one hole therethrough, said substrate melting at a first temperature;

filling said hole in said substrate with a paste consisting essentially of a ceramic sealing material which melts at a second temperature that is less than said first temperature at which said ceramic substrate melts, a ceramic stabilizing material which melts at a third temperature that is greater than said second temperature at which said ceramic sealing material melts, and an organic carrier for suspending said ceramic sealing material and said ceramic stabilizing material together in order to form said paste;

heating said ceramic substrate and said paste to about 250° C.–300° C. for about 10 to 15 minutes to burn off substantially all of the organic carrier within said paste;

additionally heating said ceramic substrate and said paste to about 490° C.–530° C. for about 1 to 5 minutes in order to melt the ceramic sealing material and thereby form molten ceramic sealing material, whereby said molten ceramic sealing material fills interstices in the hole; and cooling the ceramic substrate in order to cause said molten ceramic sealing material to solidify within said hole.

6. A method of closing holes in a ceramic substrate comprising the step of filling the holes with a paste consisting essentially of a ceramic filler material, said ceramic filler material comprising on a 100 percent total weight basis from about 20% to 75% by weight glass powder and from about 25% to 80% by weight alumina powder, said ceramic filler material being suspended in an organic carrier of methyl acetate and terpineol in order to form said paste, wherein the weight ratio of said ceramic filler material to said organic carrier is in the range of about 5:1 to 20:1 and wherein said paste has a viscosity in the range of 75,000 centipoise to 100,000 centipoise.

* * * * *